United States Patent [19]

Beaver, II et al.

[11] 4,178,113

[45] Dec. 11, 1979

[54] BUFFER STORAGE APPARATUS FOR SEMICONDUCTOR WAFER PROCESSING

[75] Inventors: Robert I. Beaver, II, Menlo Park; Michael J. Adams, San Jose; George L. Prodanovich, Campbell; Paul F. Key, San Martin; Don O. Rawlings, San Jose; P. Santhanam, Sunnyvale; Susan L. Hunt, Milpitas, all of Calif.

[73] Assignee: Macronetics, Inc., Sunnyvale, Calif.

[21] Appl. No.: 857,427

[22] Filed: Dec. 5, 1977

[51] Int. Cl.$^2$ ............................................. B65G 51/02
[52] U.S. Cl. ..................... 406/10; 414/270; 414/273; 414/416; 198/347; 406/72
[58] Field of Search ............... 198/347; 302/2 R; 214/1 BB, 16.4 R, 16.4 A, 301, 309

[56] References Cited

U.S. PATENT DOCUMENTS

| | | | |
|---|---|---|---|
| 3,122,229 | 2/1964 | Engleson et al. | 198/347 |
| 3,645,581 | 2/1972 | Lasch, Jr. et al. | 302/2 R |
| 3,730,595 | 5/1973 | Yakubowski | 302/2 R |
| 3,731,823 | 5/1973 | Goth | 214/6 F |
| 3,812,947 | 5/1974 | Nygaard | 302/2 R |
| 3,921,788 | 11/1975 | Roberson, Jr. et al. | 214/1 BB X |
| 3,945,505 | 3/1976 | Frisbie et al. | 214/1 BB |
| 3,948,564 | 4/1976 | Flint | 302/2 R |
| 3,972,407 | 8/1976 | Kushigian | 214/6 BA X |
| 3,976,330 | 8/1976 | Babinski | 302/2 R |

OTHER PUBLICATIONS

IBM Technical Disclosure Bulletin, vol. 18, No. 11, Apr. 1976.

*Primary Examiner*—Albert J. Makay
*Attorney, Agent, or Firm*—Limbach, Limbach & Sutton

[57] ABSTRACT

Buffer storage apparatus is disclosed for use with a semiconductor wafer processing system having plurality of processing stations positioned along a conveyor structure and in which allowance must be made for different processing rates at different stations, the buffer storage apparatus including a first buffer storage station positioned between a first and a second processing station for temporarily holding wafers received from the first processing station and then conveying them to the second processing station, and a second buffer station positioned between the second processing station and the third processing station and including means for conveying a wafer received from the second processing station to the third processing station or for temporarily holding it.

23 Claims, 17 Drawing Figures

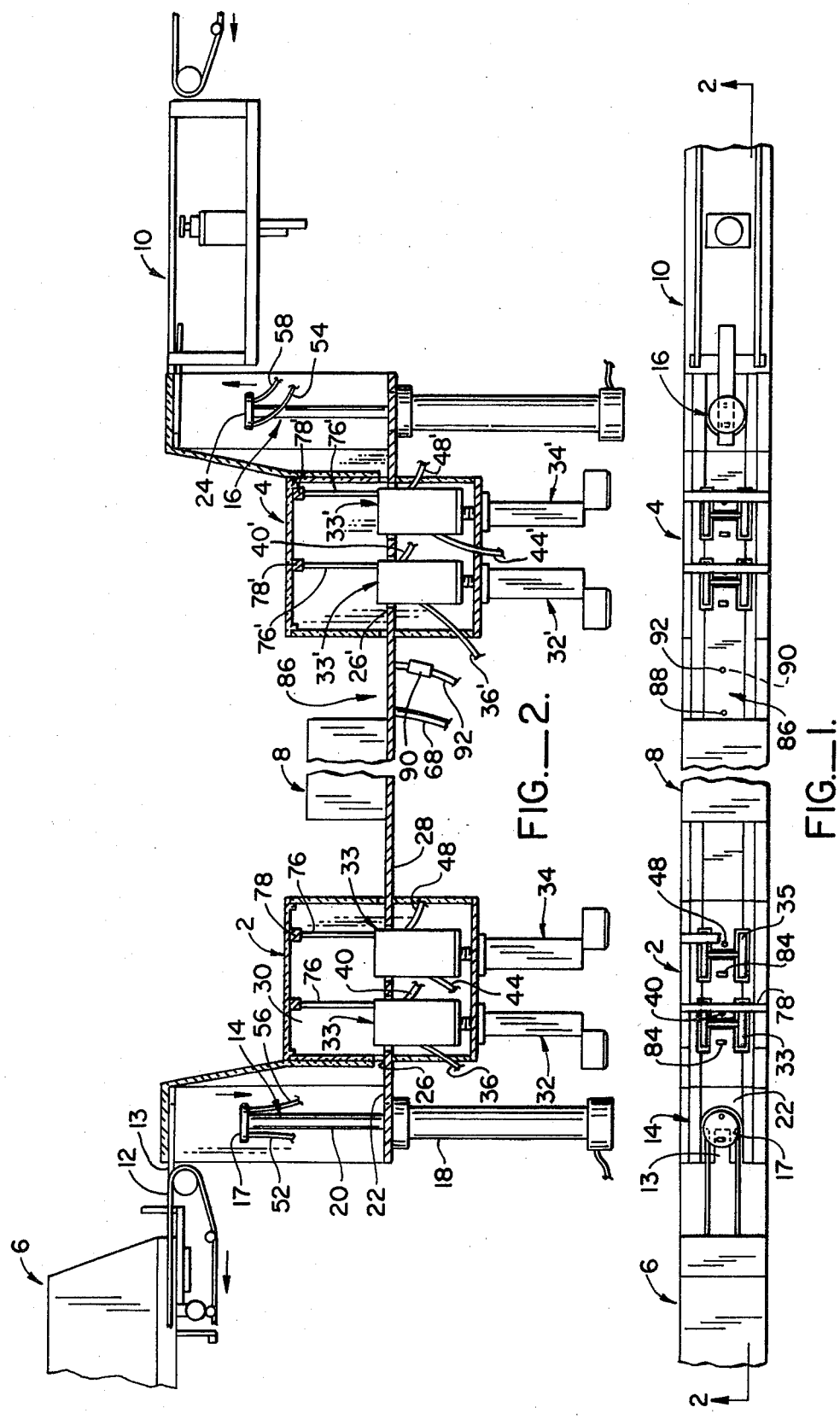

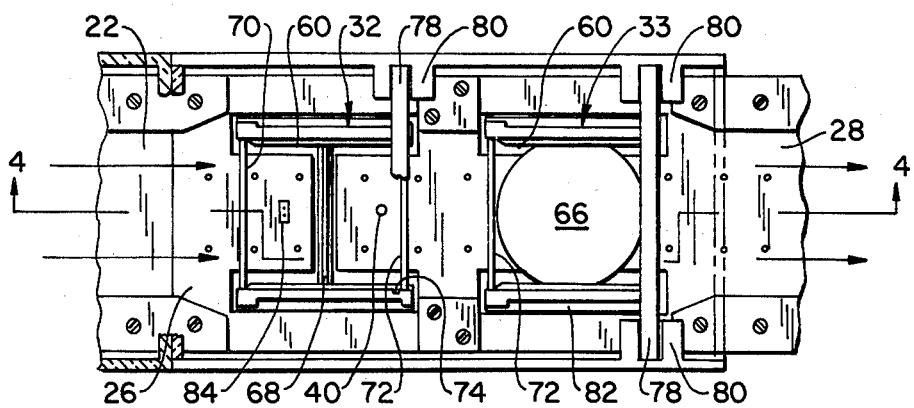
FIG._3.
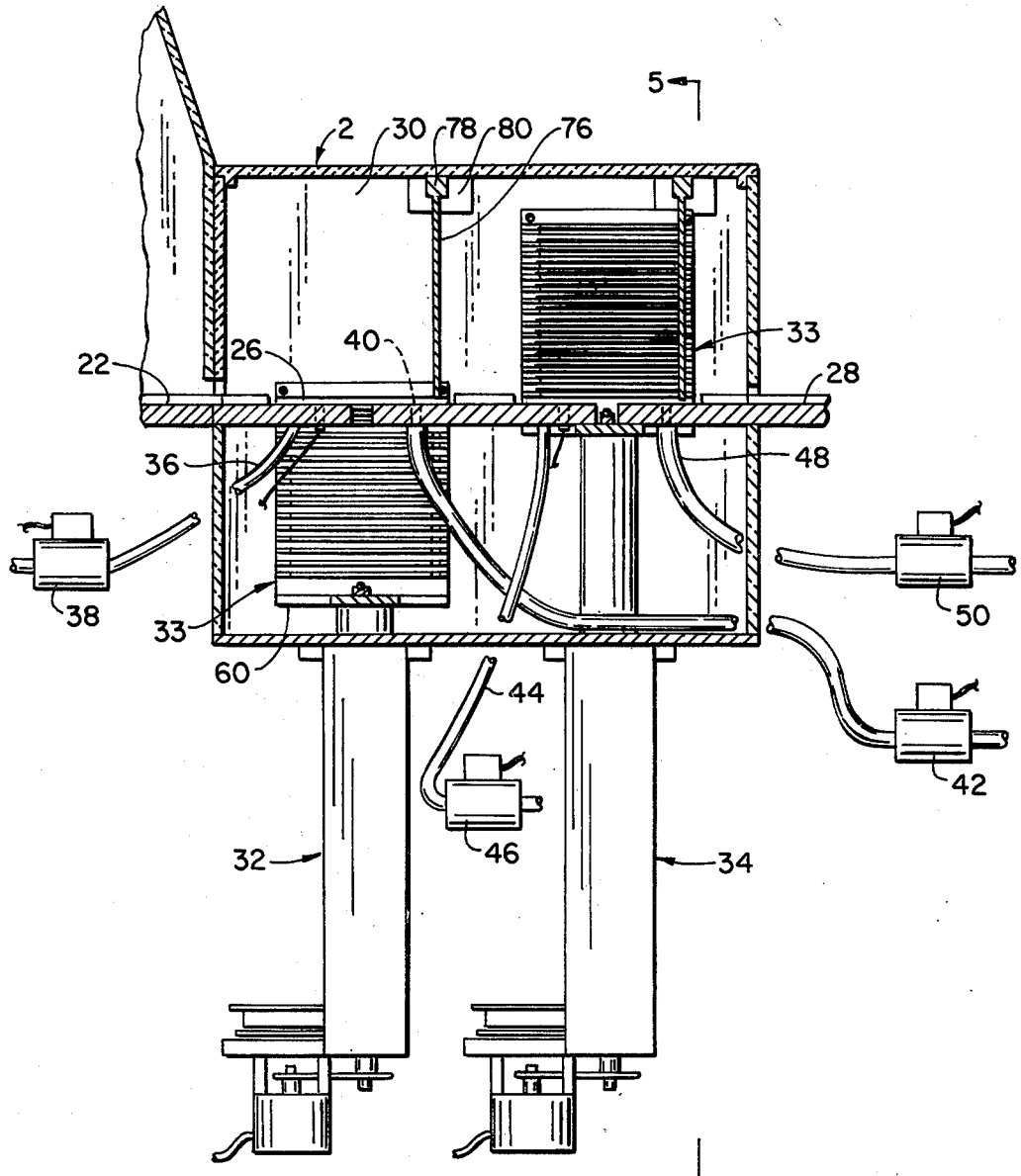
FIG._4.

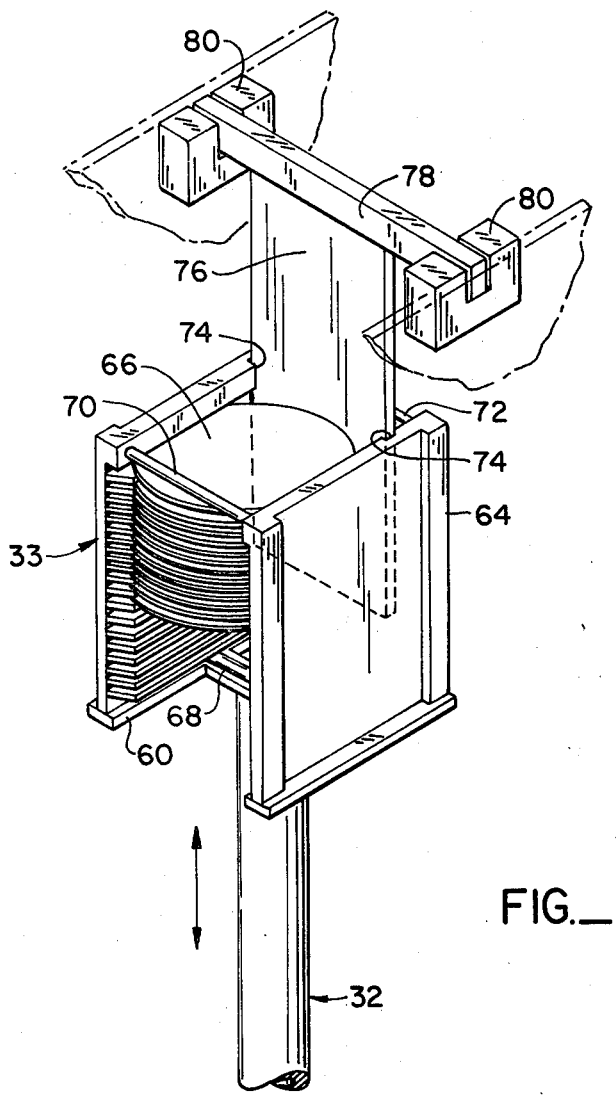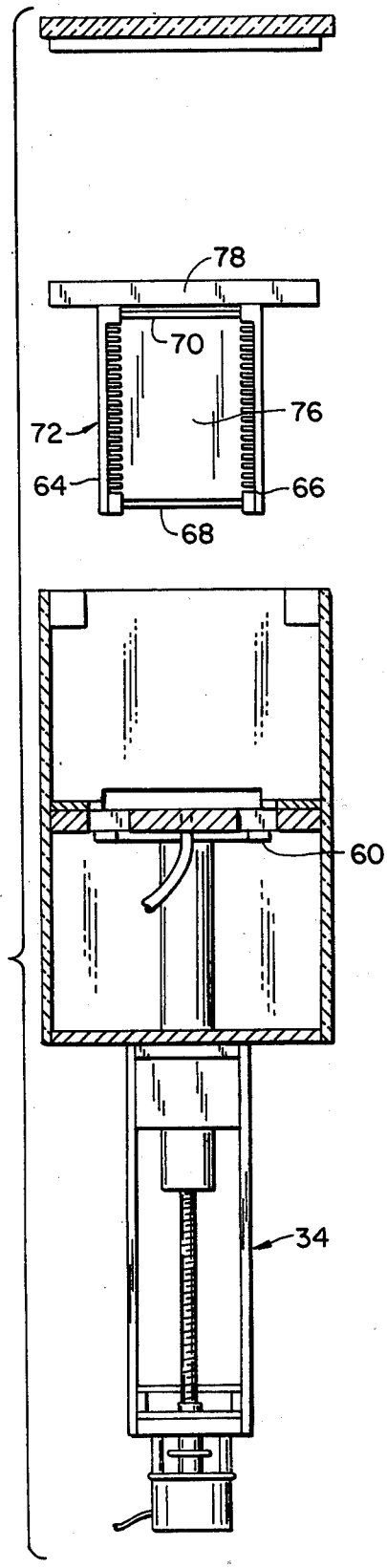

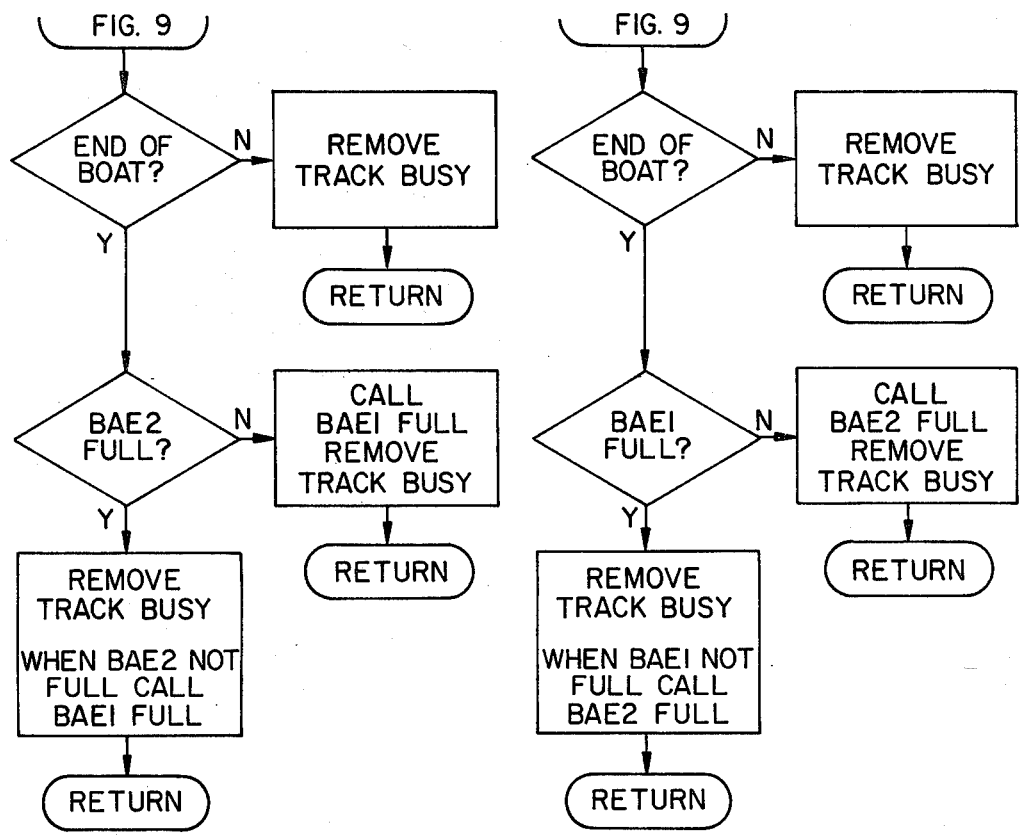
FIG._9.
(PAGE 3)
FIG._7.

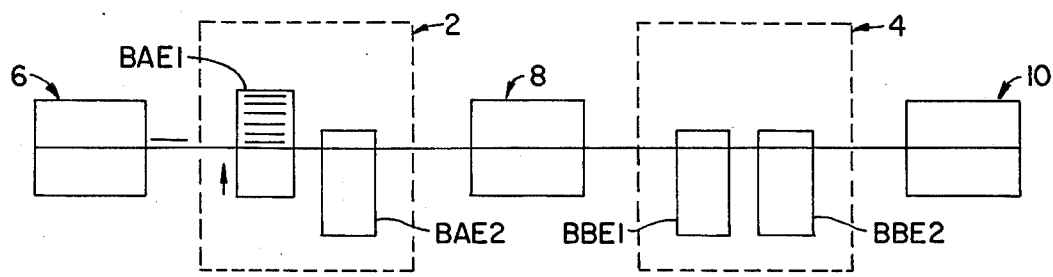
FIG._8A.
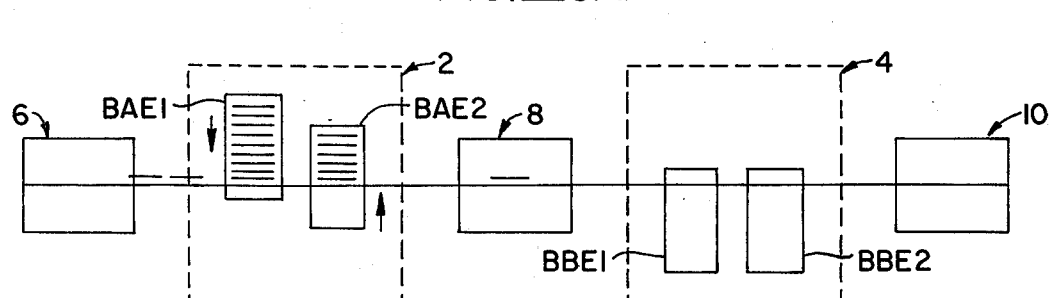
FIG._8B.
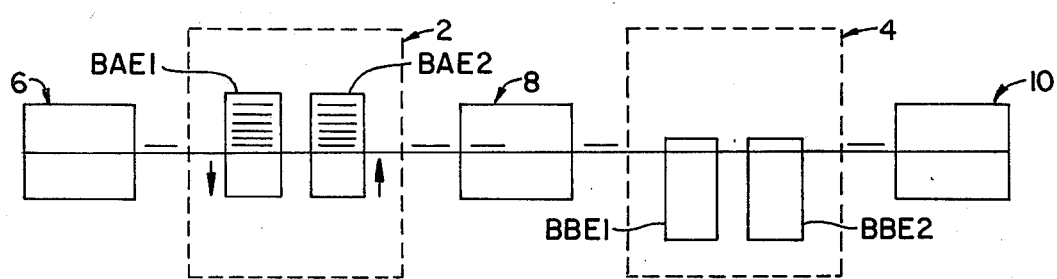
FIG._8C.
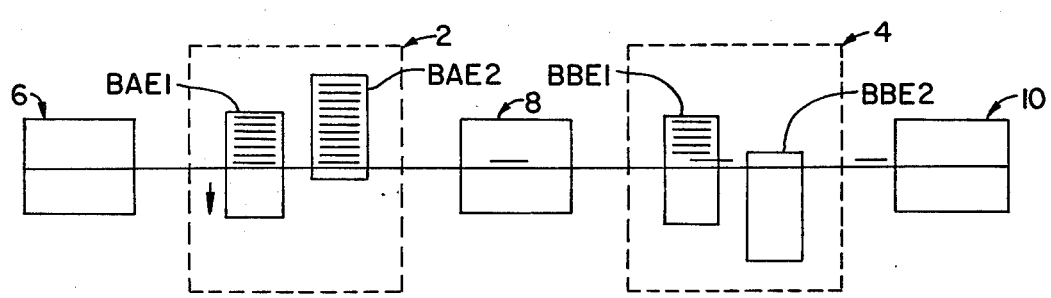
FIG._8D.
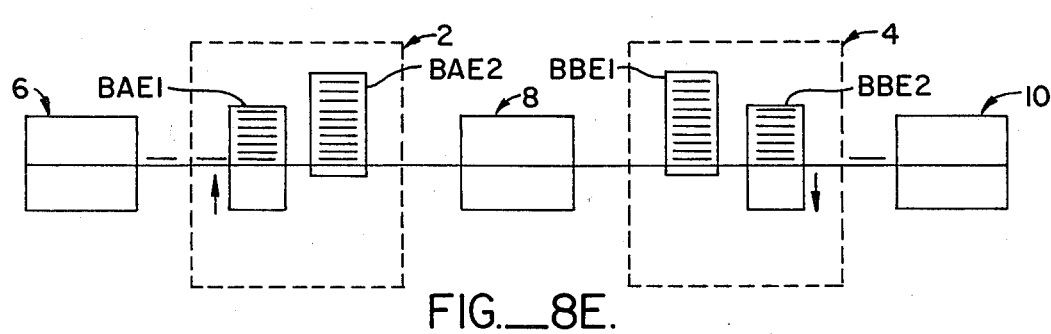
FIG._8E.

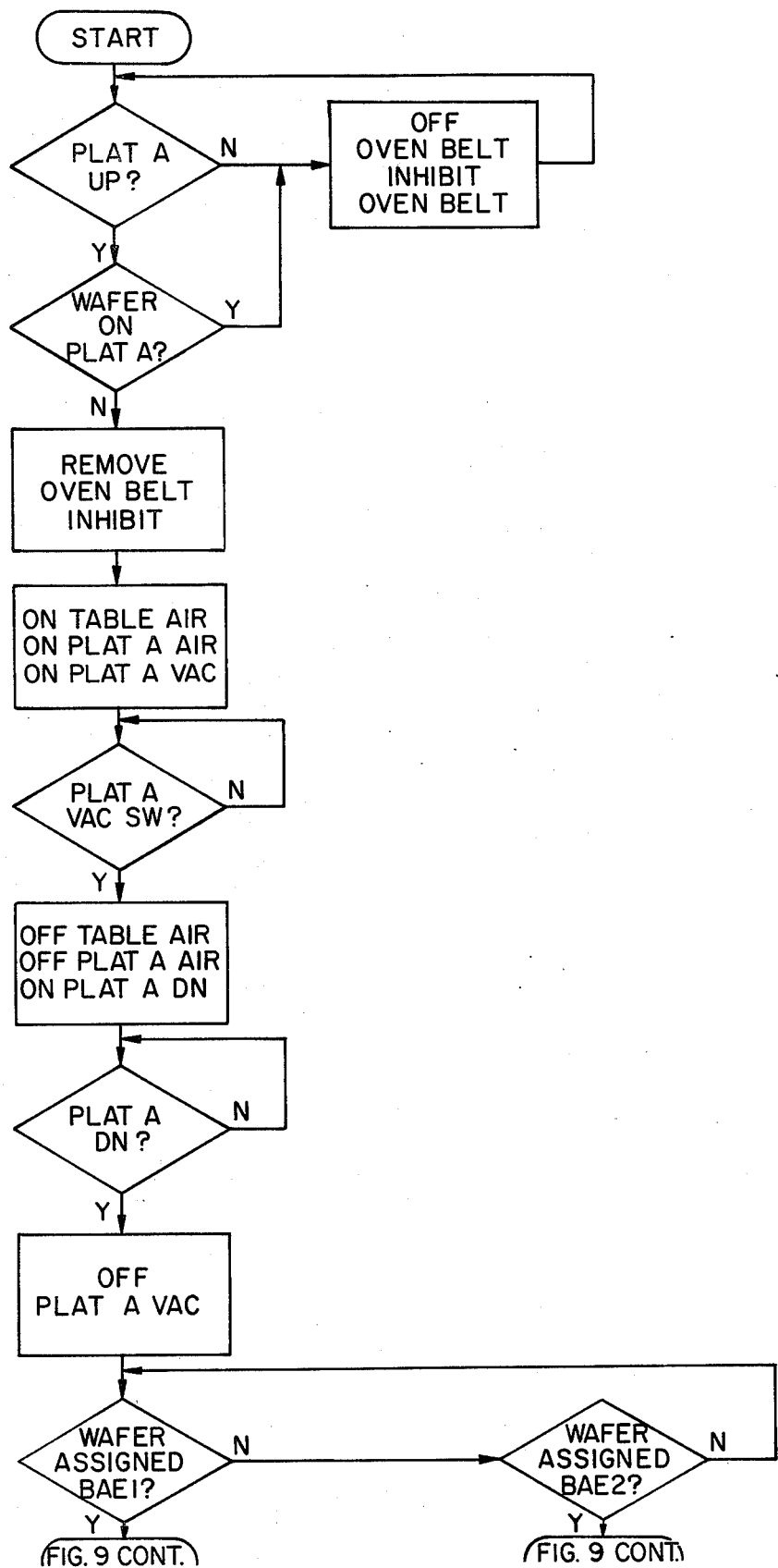
FIG._9.

FIG._9.
(PAGE 2)
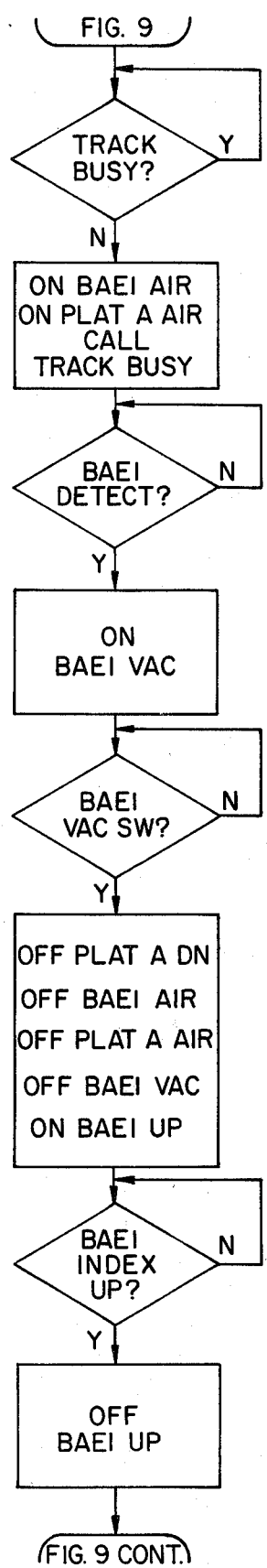
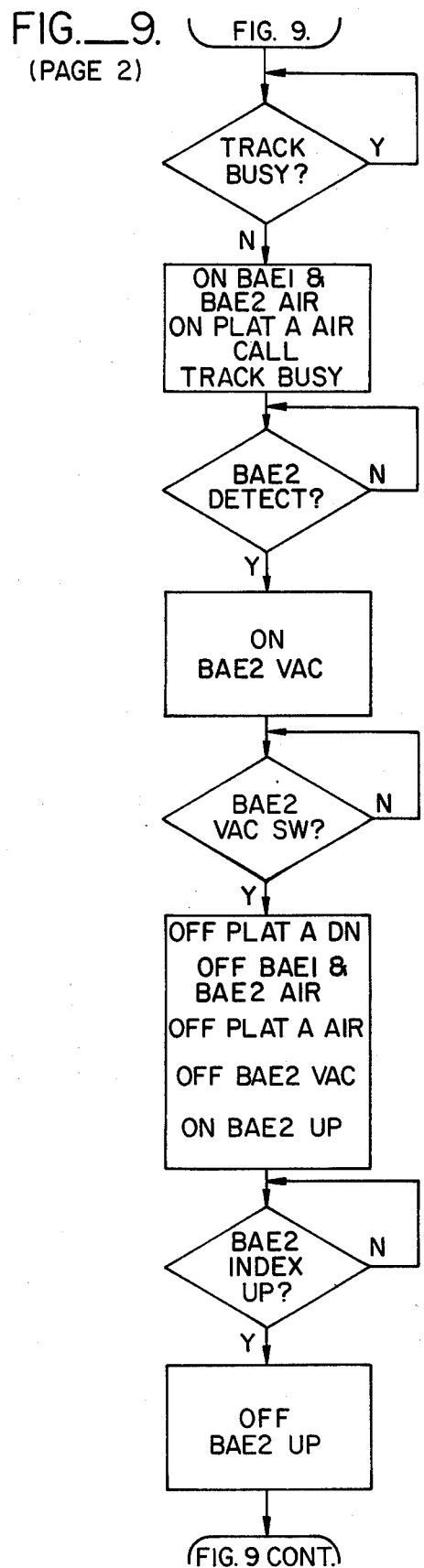

FIG._10.
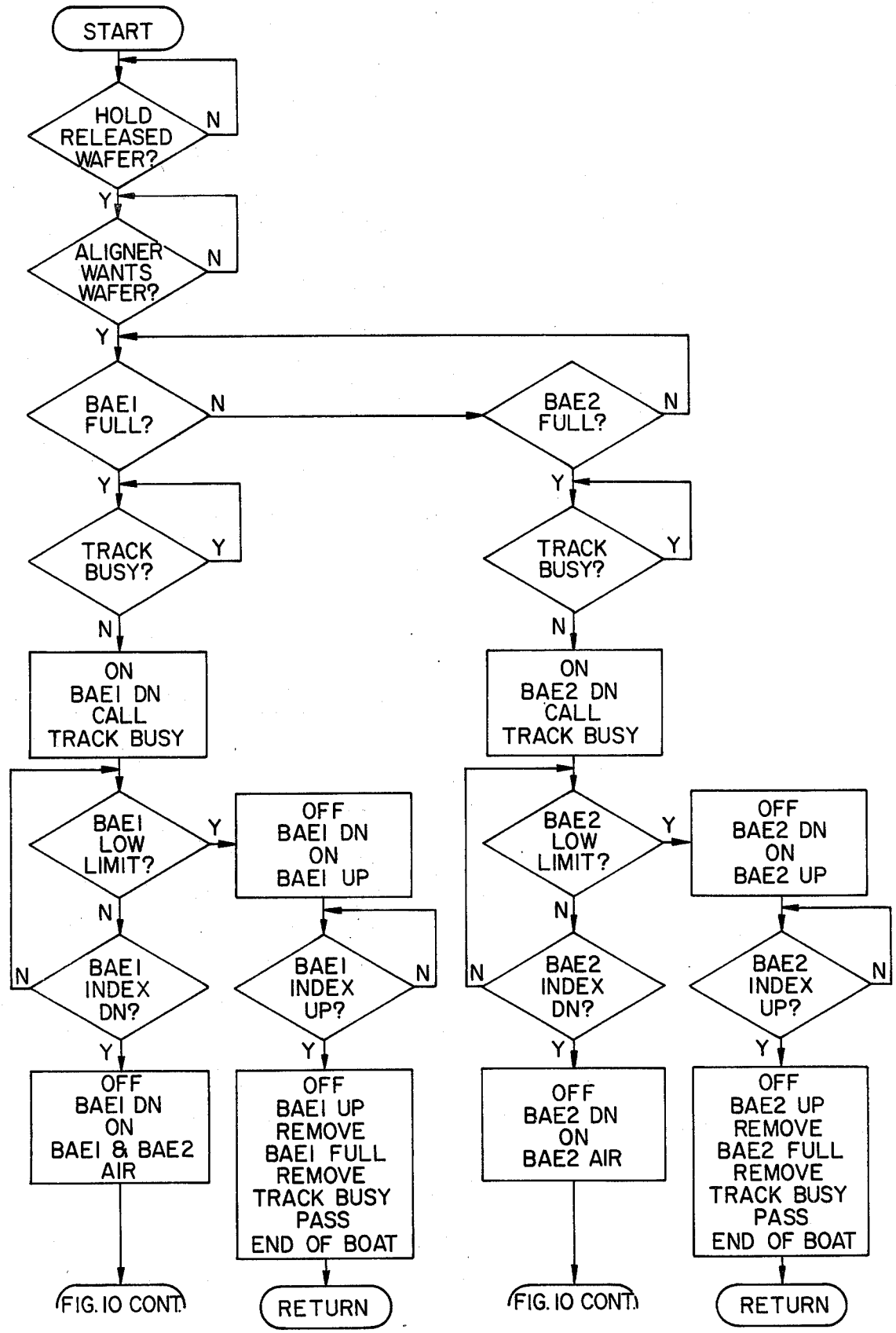

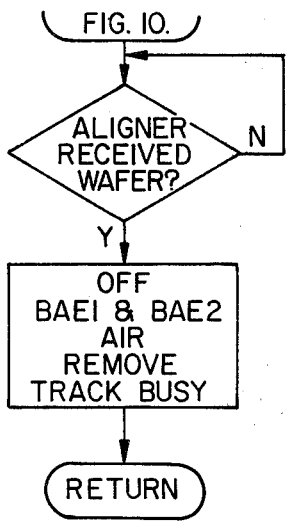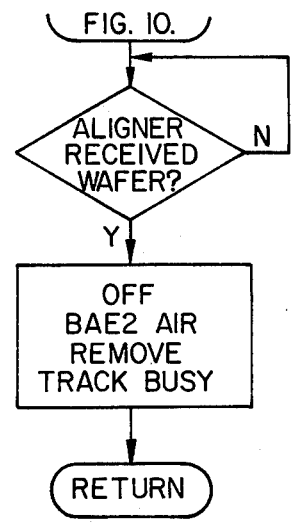
FIG.__10.
(PAGE 2)

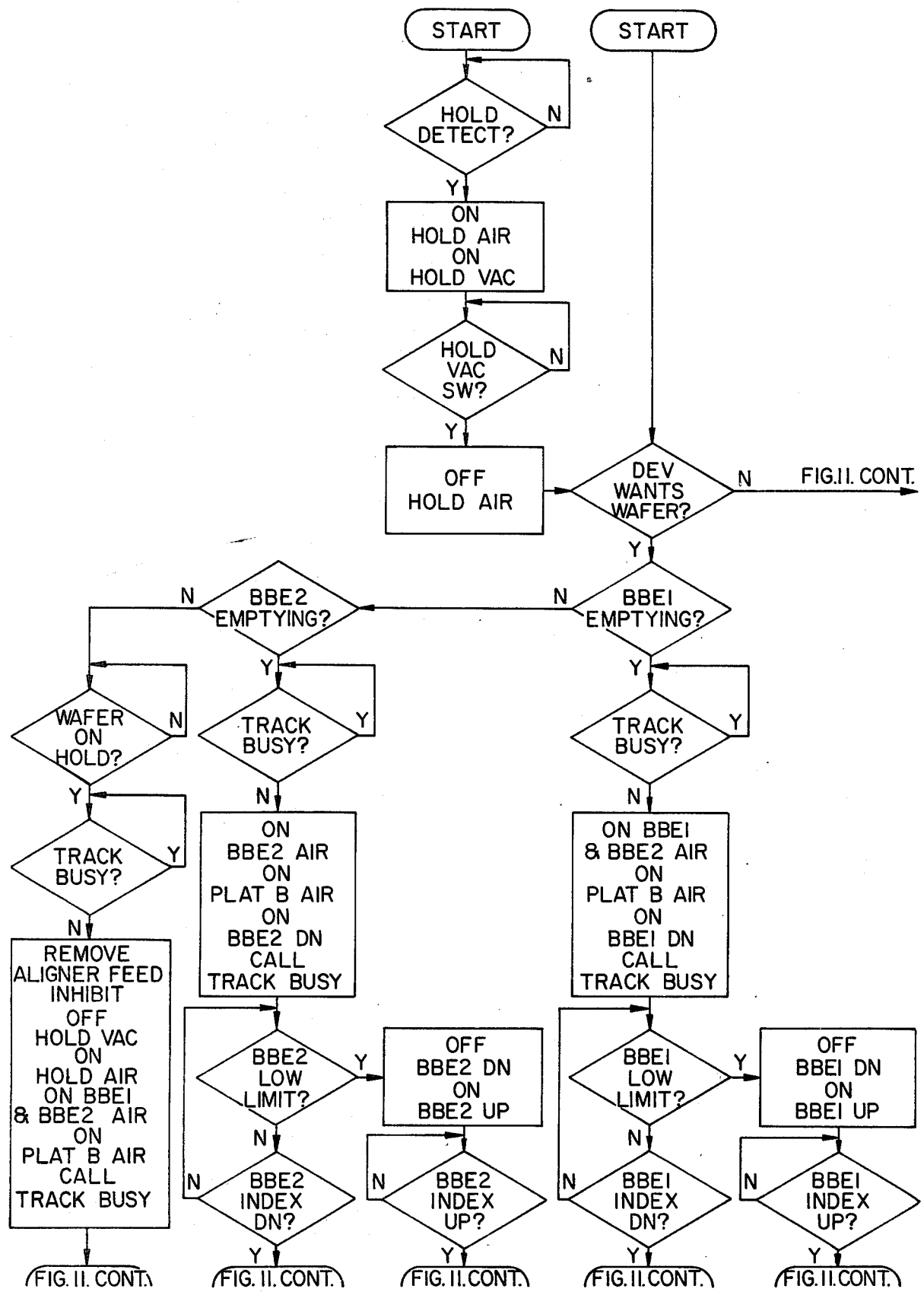

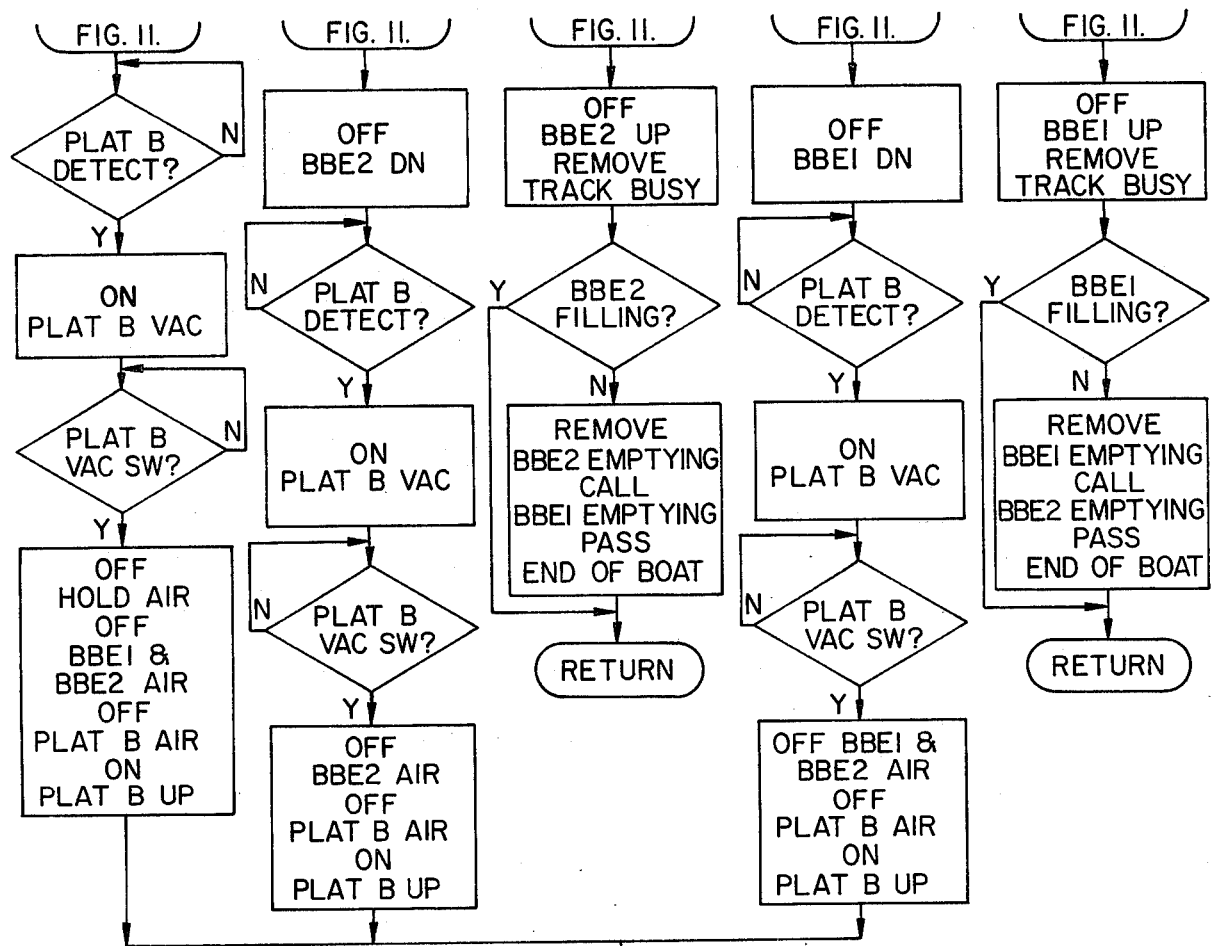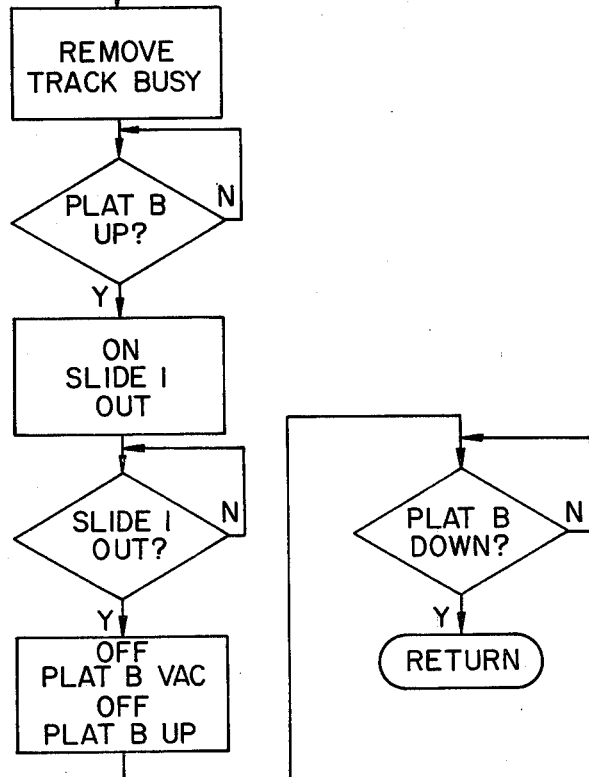
FIG._11.
(PAGE 2)

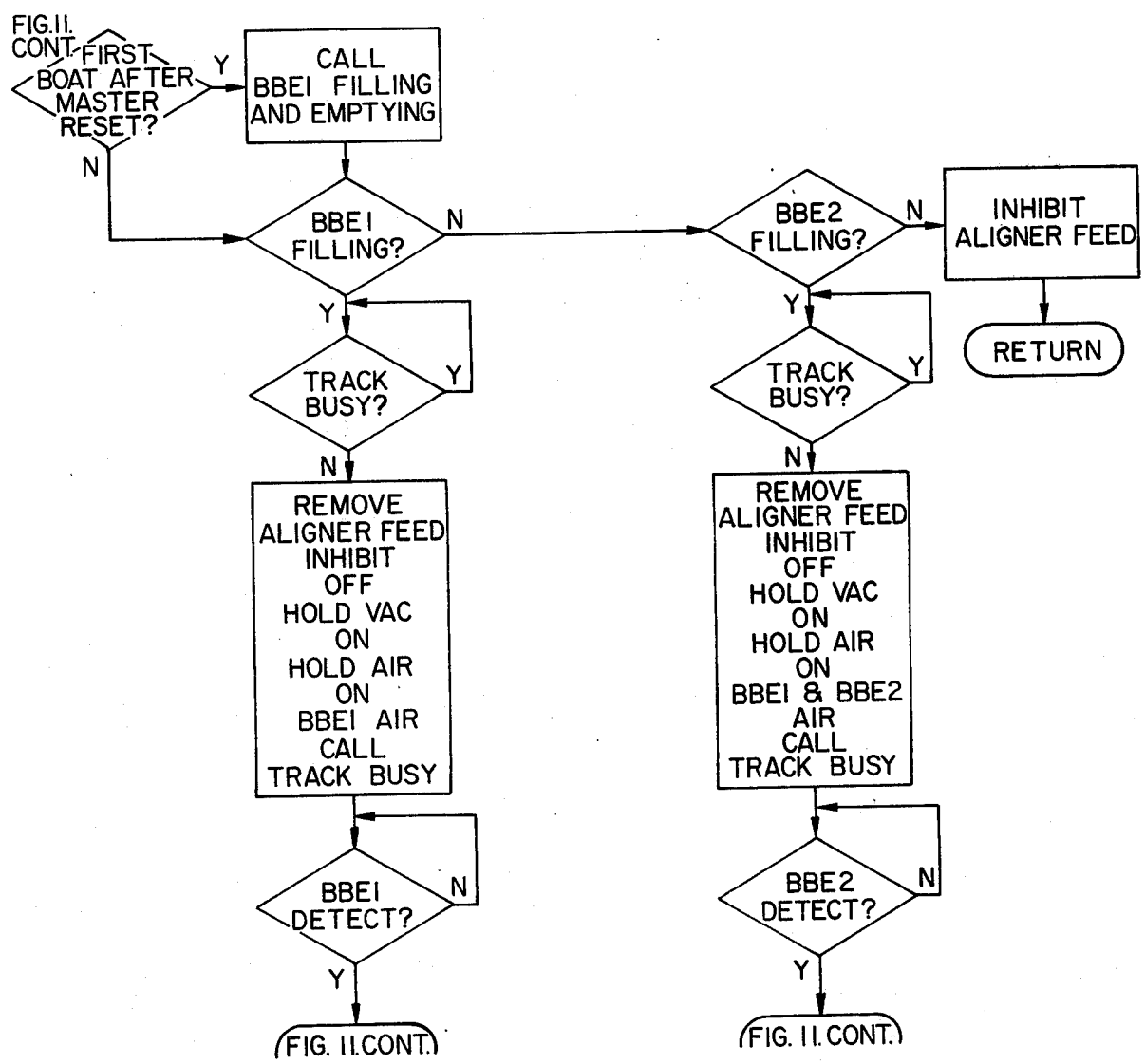
FIG.__11.
(PAGE 3)

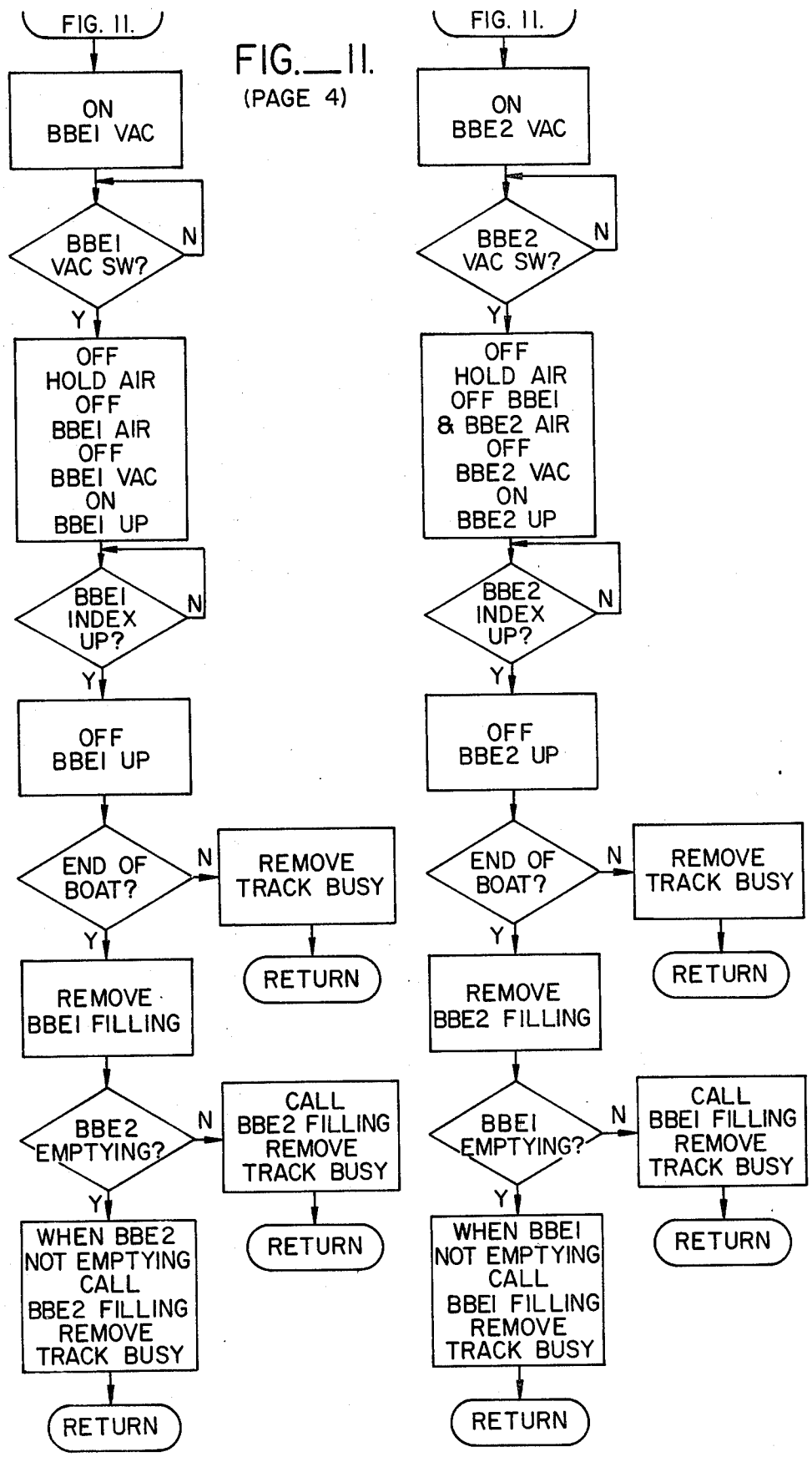
FIG._11.
(PAGE 4)

BUFFER STORAGE APPARATUS FOR SEMICONDUCTOR WAFER PROCESSING

BACKGROUND OF THE INVENTION

In processing wafers of semiconductor material for fabrication into finished semiconductor devices, numerous processing steps are required. These steps may include grinding, polishing, vapor deposition, formation of various other types of elements on the wafer, heating in ovens, aligning wafers to predetermined orientations for photolithography, cleaning, scribing and cutting, and numerous other operations. Since each of these operations is distinctly different from the others, the operations are performed at numerous different stations during the preparation of the wafer. Historically, such wafers were often processed in batches with the wafers being collected in containers or "boats" at the end of each processing step and then manually transported and inserted into the next processing station. In the continuing quest for increased efficiency in processing, it has become desirable to process the wafers in a manner and structure as nearly automated and continuously operating as possible. Accordingly, in modern wafer processing facilities numerous different processing stations have now been linked together by conveyor structures which transport the wafers more or less continuously through each processing station and from each processing station to the next. While fully continuous operation is most desirable, such is generally unobtainable due to varying processing rates at the various processing stations, such that certain stations can process wafers very rapidly while others may operate at a considerably slower throughput rate. Additionally, malfunctions or processing difficulties may cause occasional backups in the processing sequence or interruptions in the feeding of wafers.

In order to mitigate the effects at later processing stations of any such processing problems, it is important that some form of buffer storage apparatus be provided to accumulate wafers coming from one station when the next station is not yet available and for providing a source for a continuous supply of wafers when the incoming supply from the previous station is interrupted. For the purposes of quality control it is also necessary that some means be provided for maintaining the identity of different groups of wafers being processed, in order that quality control and reject rate evaluation may be identified to specific groups of wafers. Prior art of this nature, such as in IBM Technical Disclosure Bulletin, Vol. 18, No. 11, has taken the form of an elevator consisting of parallel belts having opposed wafer supporting bars for lifting and storing a predetermined number of wafers from one conveyor, with transfer mechanisms for them moving the wafers to another conveyor. Other prior art apparatus, such as U.S. Pat. No. 3,353,651, has provided a bay of fixed dimensions off to the side of the conveyor for receiving any excess number of conveyed items moving along the conveyor. All of these prior art devices have suffered from one or more disadvantages. Among these disadvantages have been the inability to place certain of the prior art devices, such as those of U.S. Pat. Nos. 3,731,823 and 3,945,505, in line with a continuing conveyor, thus requiring a plurality of conveying paths and means for transferring wafers from one path to another. Another disadvantage frequently encountered, as with U.S. Pat. No. 3,122,229, has been the provision of a nonremovable storage chamber which can store only a limited number of incoming items, and the inability to maintain the identity of different groups of wafers being processed, which is necessary in order that quality control and reject rate evaluation may be identified as to specific wafer groups.

SUMMARY OF THE INVENTION

It is an object of the present invention to overcome the disadvantages of the prior art by providing buffer storage apparatus which may be incorporated within a wafer processing system having a plurality of processing stations. It is a further object of the invention to provide such apparatus in which the identity of predetermined groups of wafers may be maintained during passage through the various stations. It is yet another object of this invention to provide such storage means which may be positioned intermediate various wafer processing stations positioned along a conveying structure.

To achieve these and other objects a buffer storage apparatus for use in a semiconductor wafer processing system having a plurality of processing stations spaced along a conveyor structure is disclosed which includes a first buffer storage station positioned between a first and a second processing station and a second buffer storage station positioned between the second processing station and a third processing station. The first buffer storage station includes first means for receiving and temporarily holding a first wafer group comprising a predetermined number of such wafers received from the first processing station and then supplying wafers from that group to the second processing station, and means for conveying a wafer received at the first buffer storage station to the first holding means and from that first holding means toward the second processing station. The second buffer station includes means for conveying a wafer received from the second processing station through the second buffer station to the third processing station if the third processing station is available for receiving such a wafer. The second buffer station also includes means for temporarily holding such a wafer received from the second processing station if the third processing station is unavailable for receiving the wafer and then subsequently supplying that held wafer to the third processing station when the third processing station is available.

In one embodiment of this invention signals indicating the availability or unavailability of the various stations for receiving wafers are interconnected through means of a digital computer for controlling the feeding and/or storage of wafers at the various buffer storage stations. The sequences of feeding or holding wafers are controlled in such a manner as to maintain the integrity of various groups of wafers being processed through the entire system so that there is no intermingling of wafers among the various groups.

BRIEF DESCRIPTION OF THE DRAWINGS

A particularly preferred embodiment of this invention will be described in detail with respect to the illustrations herein, in which:

FIG. 1 is a top view of the wafer processing system incorporating buffer storage apparatus according to this invention;

FIG. 2 is a side sectional view of the apparatus of FIG. 1, taken along line 2—2;

FIG. 3 is a top view of one of the buffer storage stations of the processing system of FIG. 1;

FIG. 4 is a side sectional view of the buffer storage station of FIG. 3, taken along line 4—4;

FIG. 5 is an end sectional view of the buffer storage station of FIG. 4, taken along line 5—5;

FIG. 6 is a fragmentary perspective view of a portion of the buffer storage station of FIGS. 3-5;

FIG. 7 is a schematic representation of the computer with its inputs and outputs for controlling the operation of the wafer processing system of FIGS. 1 and 2;

FIGS. 8A-8E are schematic representations of the various operational events occurring during operation of the wafer processing system of FIGS. 1 and 2;

FIG. 9 covering three pages, is a flow chart indicating the sequence of operation of the system of this invention as a wafer travels from the first processing station to the first storage unit;

FIG. 10 extending over two pages, is a flow chart indicating the operation of the system of FIG. 9 as a wafer travels from the first storage unit to the second processing station; and FIG. 11 extending over four pages, is a flow chart indicating the operation of the system of FIGS. 9 and 10 as a wafer travels from the second processing station to the second buffer station and then to the third processing station.

DESCRIPTION OF A PREFERRED EMBODIMENT

One illustrative and particularly preferred embodiment of the buffer storage arrangement of this invention is illustrated with respect to a system incorporating a plurality of wafer processing stations in FIGS. 1 and 2. In this particular embodiment two buffer storage stations 2 and 4 are illustrated in conjunction with three wafer processing stations 6, 8 and 10, which may conveniently comprise respectively a wafer baking oven, a wafer aligner and a wafer developing station. Since the details of these three wafer processing stations 6, 8 and 10 form no part of this invention, they are represented only in schematic form. Additionally, it is to be noted that, while two buffer storage stations 2 and 4 are illustrated interposed between three successive processing stations 6, 8 and 10, the invention is equally applicable to any number of processing stations and buffer storage stations. Accordingly, the number of processing stations and buffer storage units illustrated and described is to be considered as only illustrative of the principles of the invention, which are equally applicable to any other number of stations.

In the present embodiment the first processing station 6 is illustrated suitably as being an oven for processing the wafers at an elevated temperature, and through which the wafers are carried on a suitable conveyor belt 12. In this particular embodiment, the buffer stations 2 and 4 and the second processing station 8 are illustrated as being at a level substantially below the level of first and third processing stations 6 and 10, respectively. Such a situation frequently arises due to the physical requirements of the various processing stations and the resulting plant layouts. In view of this difference in levels, the movement of wafers through the system requires that they be moved between the various appropriate levels. For this purpose, two transfer elevators 14 and 16 are provided. First elevator 14 includes a carrying surface or platform 17 which is normally maintained at the same level as conveyor 12 for receiving wafers off conveyor 12 from first processing station 6. A wafer leaving the conveyor 12 is first received onto a table 13 where it may be momentarily held if the transfer elevator 14 is not immediately aligned at that level to receive the wafer. This table 13 includes conventional means such as a controllable air track for conveying the wafer from the conveyor 12 to the transfer elevator 14 and also includes means such as a optoelectronic detector and a controllable vacuum port for detecting the presence and holding a wafer thereupon, although these means are not illustrated in FIGS. 1 and 2 in order to avoid cluttering the illustrations. Conventional means (such as an optoelectronic device not illustrated) detect the receipt of a wafer from the table 13 onto platform 17 and activate a pneumatic cylinder 18 to lower the piston support 20 of platform 17 to bring that platform 17 down to the level of air conveyor track 22, which suitably is aligned with the buffer stations 2 and 4 and with the second processing station 8. This first transfer elevator 14, suitably designated "elevator A", along with its controls may be a very simple affair functioning to lower a wafer to the air track 22 level automatically upon receipt of such a wafer, and then to return the platform 17 to its upper position aligned with table 13. Such controls and structures are well known to those skilled in the art and thus, for reasons of simplification, are not illustrated in detail.

Second transfer elevator 16, conveniently referred to as "elevator B", is substantially identical in configuration to elevator A (first elevator 14) and serves to lift wafers received up to the level of third processing station 10. Third processing station 10 suitably may be a station for depositing liquid material upon the wafer equipped with transport apparatus, all such as disclosed in U.S. Pat. No. 3,921,788 to Roberson, Jr. et al, and assigned to the assignee of the present invention. Thus, such third processing station 10 provides the necessary slide means for removing a wafer carried on the support 24 of second elevator 16.

Between the first and second transfer elevators 14 and 16, respectively, are positioned the first and second buffer stations 2 and 4, with the second processing station 8, which may suitably be a wafer aligner, positioned between those buffer stations.

Each of the buffer stations 2 and 4 may suitably be such as those illustrated in FIGS. 3-5. Since the structures of the two buffer storage stations 2 and 4 are substantially identical, the structures of such a buffer storage station will be discussed in detail with respect to first buffer storage station 2, with the reference numbers used in that storage station being primed and used to denote the corresponding structures in the second storage station 4.

The first buffer station 2 includes a length of conveyor track 26 for conveying wafers received from the first processing station 6 and thence from transfer elevator 14 into the buffer storage station and, at a suitable time, on outwardly from that buffer storage station. This conveyor track 26 preferably is in the form of a conventional air track well known in the art and which conveys a semiconductor wafer in an almost frictionless manner on a thin film of air between the track 26 and the wafer. This buffer station air track 26 matches up on the incoming side with the air track 22 leading from the transfer elevator 14, and on the other side with air track 28 which extends between the first and second buffer stations and through second processing station 8. The buffer station 2, and also elevator 14, are enclosed within a housing 30, suitably of a rigid, transparent plastic material or metal combined with plastic. Mounted below the air track 26 is a pair of wafer receiving container elevators 32 and 34 mounted in tandem along the air track 26. These elevators 32 and 34 suitably are substantially similar to those disclosed in detail in FIG. 5 of the above-referenced Roberson, Jr. et al patent U.S. Pat. No. 3,921,788 and are controlled in their raising and lowering in a manner to be described below. In this first buffer station 2, which may be referred to as buffer station A, the first elevator 32, when combined with a wafer holding container 33, may also be referred to as buffer A, elevator 1 (BAE1) and the second elevator 34, when combined with a wafer holding container 33, may be referred to as buffer A, elevator 2 (BAE2). Similarly, in the second buffer station 4, which may be referred to as buffer station B, the first elevator 32' may also be referred to as buffer B, elevator 1 (BBE1) and the second elevator 34' may be referred to as buffer 8, elevator 2 (BBE2).

As illustrated best in FIG. 4 the portion of the conveyor track 26 adjacent and leading into the elevator 32 (BAE1) is provided both with a source of pressurized air 36 which is controlled by a solenoid valve 38 for selectively activating that portion of the air bearing track 26 under the command of the valve 38. Additionally, this first elevator position is provided with a vacuum port 40 which is connected through solenoid valve 42 to an evacuating source. Similarly, the portion of the air track adjacent the second elevator 34 (BAE2) is also provided with a source of compressed air 44 controlled by a suitable solenoid and valve 46 and a vacuum port 48 connected through a suitable valve 50 to an evacuation source. Similar solenoid valve controlled pressurized air supplies 52 and 54 and controlled vacuum sources 56 and 58 are provided to the platforms of transfer elevators 14 and 16 respectively, and a similar air source is also provided (but not illustrated) for table 13.

The uppermost end of elevator 32 is provided with a generally H-shaped saddle 60 for receiving a wafer holding container 33. This container or boat 33 is provided with a plurality of slotted storage positions in which each position can receive the edges of an individual wafer and support that wafer by its edges. The storage container 33 suitably may comprise two mutually opposed slotted side pieces 64 and 66 joined by cross bars 68, 70 and 72, as illustrated in FIG. 6. By this construction the container 33 may be supported on the H-shaped upper saddle 60 of the elevator 32 and, when empty, may be lowered through the H-shaped slot which accommodates the elevator saddle 60 in the midst of air track 26, as illustrated in FIG. 4. The upper end of second elevator 34 is similarly provided with an H-shaped saddle for receiving a wafer holding container 33, which is substantially identical to container 33. In FIG. 4 this second container 33 is illustrated as being substantially full of wafers 66 and supported in an elevated position, from which it may be removed from elevator 34, if desired.

From FIG. 6 it may be seen that the longitudinal end of each container 33 which is to the rear with respect to the direct of wafer travel as indicated by the arrows in FIG. 3, is provided with two mutually opposed generally vertically extending slots 74, which extend from the top of the container 33 to the bottom. These slots 74 are so dimensioned as to slidably receive a wafer retaining plate 76, which may be lowered generally vertically downward into the slots 74. A cross member 78, having a length somewhat greater than the maximum width of plate 76, is attached extending across the upper end of plate 76.

The wafer retaining plate 76 and its attached cross bar 78 may be dropped into the slots 74 of the wafer carrier 33 at any time that the container 33 is removed from its position atop the elevator upper saddle 60, thus serving to prevent any wafers contained in the container 33 from being discharged inadvertently out the back end of the carrier. The cross bar 78 suitably is dimensioned such that, when the container 33 is placed upon the upper saddle 60 of the elevator, the cross bar 78 will be received into a pair of opposed, U-shaped holders 80 affixed to the inside of the buffer station housings 30, as illustrated in FIG. 6. Thus, as the elevator 32 is lowered and thus lowers the wafer container 33, the retention of the cross bar 78 in the holders 80 will serve to withdraw the plate 76 from the slots 74 in the container 33. Suitably the length of the plate 76, measured in a vertical direction in FIGS. 4, 5 and 6, is such that, when the container 33 is removed from the buffer storage station the plate 76 will completely fill the back end of the container but, when the container 33 is inserted into the buffer storage station with the cross bar 78 being retained by the holders 80, the lowermost portion of the plate 76 extends downward to a point just sufficiently above the air track 26 to permit a wafer to pass thereunder. Accordingly, the plate does not prevent the passage of any wafers through the carrier under the influence of the air track, but does retain from inadvertently spilling out the back of the container 33 all wafers which are held in slots raised above the air track. Additionally, the loose reception of the cross bars 78 into the holders 80 enables the removal of a wafer bearing container 33 from the elevator saddle 60 to cause the plate to slide all the way into the slots 74 and then be removed with the container 33 to protect the wafers contained therewithin from spilling out the back end of the container. Upon reinsertion of such a container or insertion of another onto the saddle 60, the reception in the holders 80 of the cross bar 78 will again effect withdrawal of the plate 76 upon the lowering of the container 33.

As illustrated most clearly in FIG. 3, each elevator position in each of the buffer stations 2 and 4 is provided with a means 84 for sensing the presence or absence of a wafer at that position. Suitably this wafer sensing means may be an optoelectronic module similar to a Texas Instruments type TIL139, which may conveniently sense the presence or absence of a wafer by the presence or absence of means for reflecting light from a source into a detector. Such a device 84 may conveniently be used for various applications in this equipment in which the presence or absence of a wafer must be determined, such as on the buffer station elevators and on the table 13.

An additional location in which the optoelectronic wafer sensor is used is at an additional hold station 86 which is positioned between the second wafer processing station 8 and the second buffer storage unit 4, as illustrated in FIGS. 1 and 2. This hold station 86 is provided to temporarily stop a wafer traveling between the second processing station 8 and the second buffer storage station 4 and includes a separately controllable air track air supply 88, a device 90 for sensing the presence or absence of a wafer at that station and controllable means 92 for stopping a wafer at that hold station when desired. Such stopping means 92 conveniently may comprise a port in the air track connected to tubing which is in turn joined to a vacuum pump through a selectively controllable solenoid valve, such as the solenoid valves described above. The wafer presence sensing means 90 in this station and also on the transfer elevators 14 and 16 may suitable comprise a vacuum switch in the line 92 whereby the presence of a wafer over the vacuum port closes that port and enables a vacuum to be drawn in that line, thus indicating the presence of a wafer. In the absence of a wafer the open port would not permit a vacuum to be drawn and the switch 90 would not be activated. As noted above, similar combinations of controllable air sources, wafer detecting means and wafer stopping vacuum means are provided for each of the buffer station elevators and for each of the elevators 14 and 16, with table 13 including such a controllable air source and suitable wafer detecting means.

The operation of the numerous components of this buffer storage assembly are controlled by a process controller in the form of a programmed general purpose digital computer 100, which suitably may be a PACE microprocessor such as a model IPC-16A/500D manufactured by National Semiconductor, plus suitable and well known memory and input/output peripheral equipment. A flow chart for a computer program to carry out the automated control of such a buffer storage system is illustrated in FIGS. 9-11. The computer listing (source code) for a computer program to carry out the requirements of the operation is set forth in Appendix II. Apendix I provides a definition of the program variables and a description of the instruction implementation used to interpret the computer program of Appendix II. The general operation of this apparatus, under the control of the computer program corresponds to that shown in the flow diagrams of FIGS. 9-11, and generally is as described below. It should be noted that the computer program controlling this operation represents a subroutine for a larger overall program controlling the operation of an entire wafer processing system, which includes not only the two buffer storage stations 2 and 4 and the three wafer processing stations 6, 8 and 10, but also includes numerous other stations. However, since only the portion of the program directed to these five elements is relevant herein, only the operation of the subroutine controlling these five elements will be described in detail.

A first portion of the operation to be controlled is the travel of a wafer from a first processing station 6, such as a coating oven, to the first buffer storage unit. The operation begins when a wafer is detected coming off the oven conveyor belt 12 onto a table 13 area preceding the platform 17, also referred to as platform A of the elevator 14. The process control computer 100 then detects whether or not the platform A is in its uppermost position. If not, the oven conveyor belt 12 is turned off and inhibited from passing out any more wafers. If platform A is up, then a vacuum sensor determines if there is a wafer already present on platform A, and if so, again shuts off and inhibits the oven conveyor belt 12. If there is no wafer then on the platform A the computer removes the oven belt inhibit and turns on the air track air to the table 13 and onto the platform A and also turns on the vacuum port located upon the platform, so that a wafer may be carried onto the platform and then stopped there by the vacuum. Next the computer checks to see if a vacuum has been drawn on the platform, thus indicating that a wafer has been received there, and if so, turns off the table and platform air and lowers the platform A. Once a signal has indicated that the platform A is in its down, or lowermost, position, then the vacuum on the platform is turned off to release the wafer.

At this point, the computer 100 will determine, in a manner to be shown below, whether this particular wafer is assigned to the holding container 33 on the first elevator 32 (BAE1) of the first buffer storage station 2, or to the second elevator 34 (BAE2) of that buffer station. Once the wafer is assigned to either elevator/container combination BAE1 or BAE2, the procedural steps are substantially identical for either such elevator, and thus the steps for only BAE1 will be presented here.

Assuming that the wafer is assigned to the first holding means BAE1, the computer checks its memory to determine if the track 26 leading through the buffer station is busy or is currently available. If it is busy, again the wafer is allowed to remain on the platform A until the track 26 is no longer busy. Once the track is no longer busy, the computer turns on the air supply 36 for BAE1 and also turns on the air supply 52 for the platform A to convey the wafer from the platform A to the buffer station. At this time, the computer also stores a signal in its memory that calls the track into the first buffer storage station busy. Next, in a manner similar to that with the platform A, BAE1 detects the presence of a wafer at the first storage position of the first buffer storage apparatus and turns on a vacuum port to stop the wafer at that point. Once the wafer has been stopped and detected there, the computer turns off the signal maintaining platform A down, thus allowing it to rise back to the level of table 13, and turns off both the platform A air and the BAE1 air and also the BAE1 vacuum. At this same time, since wafers are being fed into the holding means BAE1, the computer causes that elevator to index upward sufficient to lift the wafer, which is then engaged within two horizontally opposed slots of container 33, to lift that wafer above the track to a storage position.

After this indexing upwardly has been completed, the computer checks to determine if the container or boat has been completely filled, by checking its memory to see if an "end of boat" signal is present. If it has not been filled, then the computer removes the initial track 26 busy signal and returns to the main program controlling the whole wafer processing system until another wafer is presented from the oven or first processing station to the platform of the elevator A, whereupon the preceding program will be repeated.

Once the container or boat has been completely filled at holding means BAE1, the computer tests to determine if the container or boat on elevator BAE2 presently contains any wafers such that it would be presenting a signal indicating that BAE2 is full. If BAE2 is indicated as full, the track busy signal, indicating that the track 26 through the first buffer storage station is busy, is removed and once the second elevator BAE2 is not full, the computer is informed that BAE1 is full. At this point, the processor returns to its main program routine. If BAE2 does not contain wafers, then BAE1 is called full by the computer and the track busy signal for track 26 is removed and the program is returned to the main routine. If the wafer coming from the platform A had been assigned to elevator BAE2, the steps would be exactly analogous with the interposition of BAE1 and BAE2.

Once wafers have been fed into the processing apparatus, the computer will then control the feeding of wafers to the second wafer processing station 8, which suitably may be a wafer aligner. Since the aligner feeds to the second buffer station 4 through the holding station 86, the computer 100 first checks to see if a wafer is at that holding station 86 and does not feed any additional wafers into the aligner until there is a wafer held there.

If there is a wafer held at station 86, the computer then checks to see if the aligner is ready to receive another wafer. Once it is, the computer then checks to see if either of the containers on first buffer storage station elevators BAE1 or BAE2 is full. If neither is full, the computer will hold off further action until one is full. Then once one of those elevators is filled, the buffer storage subroutine will be called into action. The program is essentially identical for both BAE1 and BAE2 and will thus be described only with respect to BAE1.

Once the computer 100 receives a signal that BAE1 is filled, it then checks to see if the tracks 26 and 28 from the buffer station into the second processing station are busy. If so, then this process is temporarily halted. If the tracks are not busy, then the computer 100 commands the elevator BAE1 to lower and calls the tracks 26 and 28 busy. Next the computer 100 tests to see if BAE1 has reached its lower limit. If it has reached the lower limit, then the lowering of BAE1 is stopped and the computer commands it to begin advancing upwardly until it has aligned the uppermost pair of horizontally opposed slots with the air track 26, at which time the upward command is stopped and the signal indicating that BAE1 is full is removed. Additionally, the track busy signal is removed and an "end of boat" signal is passed to the computer, indicating that the boat is empty. At this point, control returns to the master program.

If BAE1 had not reached its low limit, then the computer 100 causes BAE1 to continue downward until it has indexed a pair of the horizontally opposed slots, and thus a wafer, into position on the air track 26. At that point, the lowering command is cancelled and the air track supplies for the air tracks 26 and 28 extending through both BAE1 and BAE2 are turned on to advance the wafer presented by the container onto the second processing station. As soon as the second processing station (the aligner) indicates that it has received a wafer, then the air supply to the air tracks at BAE1 and BAE2 are turned off and again the track busy signal is cancelled and control is returned to the main program. If the signal indicating that BAE1 is full were not present and a signal were present indicating that BAE2 were full, the procedural steps would be substantially identical, with the exception that only the BAE2 air supply would be necessary to convey a wafer from BAE2 to the second processing station.

Once wafers have been fed into this aligner or other second processing station, they may then be fed to the third processing station through the second buffer storage station 4. Depending upon whether or not a wafer is present at the holding station 86, the beginning of the procedure may vary. If a wafer is fed to that holding station such that the detector 90 detects its presence, the holding station air supply 88 will continue to carry it onto the station while the holding station vacuum 92 is activated to stop it there. When the computer detects the presence of the wafer being held by the vacuum, it turns off the holding station air supply to allow the wafer to be held at the holding station. If no wafer had been at the holding station, then the foregoing steps of this paragraph would be skipped, and the subsequent procedure would continue the same, as follows.

Next the computer inquires as to whether or not the third wafer processing station, in this case the developer, is ready to receive a wafer itself. If it is ready, the computer then checks to determine if either of the containers 33' held on the second buffer station elevators 32' and 34', also referred to as BBE1 and BBE2 respectively, are emptying wafers to the third processing station, thus indicating that they are containing wafers. If neither of the elevators BBE1 or BBE2 is emptying, thus indicating that both of them are already empty, the computer 100 checks to see if there is a wafer present at the holding station 86 and, if not, waits for one to be made available at that station. Once a wafer is present at that holding station 86, the computer then checks to see if the track 26' leading from the holding station to the second transfer elevator 16 (elevator B) is busy and if so, waits until it is free. If the track is not busy, the computer removes any signals inhibiting the aligner feed, turns off the holding station vacuum and turns on the air supplies 88, 36' and 44' to the holding station and to BBE1 and BBE2. Additionally, the computer 100 turns on the air supply 54 onto platform B of transfer elevator B and calls the track 26' busy. Next, the computer checks to see if the detector adjacent platform B has sensed the presence of a wafer and, if so, turns on the vacuum 58 to retain the wafer on platform B. The computer then checks to see that the vacuum line 58 has been purged and is thus gripping the wafer and, if so, turns off the air supply 88 to the holding station and turns off the air supplies 36' and 44' to the buffer station track, and finally turns off the platform B air supply 54. Then the computer commands the platform B elevator to move from its normally lowered position to a raised position aligning it with a slide feeder from the third wafer processing station 10. The computer then removes the track 26' busy signal and checks to see if the platform B has moved to its upper position. If it is at its uppermost position the computer then commands the third processing station feeder slide to move out to grip the wafer on platform B (24), turns off the platform B vacuum and cancels the command maintaining the platform B at its upper positioning, thus allowing it to return to its lowered position. At this point, the computer returns to its master program.

If the computer had sensed that either holding means BBE1 or BBE2 were emptying, the procedure would be somewhat different. However, since it would be substantially identical if either were emptying, only the procedural steps for the emptying of BBE1 will be described here.

Upon the sensing that BBE1 is emptying, the computer checks to see if track 26' is busy. If track 26' is not busy and is thus available, the computer turns on the air supplies 36' and 44' to BBE1 and BBE2 and turns on the air supply 54 to platform B. At the same time, the computer commands elevator BBE1 to lower and calls the track 26' busy. Next, the computer checks to see if elevator BBE1 has reached its lower limit or not.

If BBE1 has reached its lower limit, the computer cancels the BBE1 lowering signal and commands BBE1 to rise until it has reached a level aligning the uppermost pair of horizontally opposed slots in the container 33' with the track 26'. At this point, the computer stops the upward movement and removes the track 26' busy signal and checks to see if BBE1 is filling with wafers received from the previous processing station. If it is filling, the computer returns to its main program. If BBE1 is not filling, the computer removes the BBE1 emptying signal and calls BBE2 emptying as well as passing an "end of boat" signal.

When the computer checked to determine if BBE1 was at its lower limit, and it was determined that it was not yet at that limit, it would then check to see if BBE1 had indexed down to align the next set of horizontally opposed slots. If it had not so indexed down, the computer would again check to see if it were at the lower limit. If BBE1 did index down, then the computer would stop the lowering of BBE1 and await a signal from the platform B detector indicating that a wafer had arrived at the platform and would then turn on the platform B vacuum to hold the wafer thereupon. Once the vacuum line indicated that a wafer was being held on the platform, the computer would turn off the air supply to BBE1 and BBE2 and also to the platform B and begin raising the platform B to its upper position aligned with the third processing station slide. From this point the procedural steps would be the same as previously described once the platform B was commanded to rise. If elevator BBE2 were emptying instead of BBE1, the steps would be substantially the same with the obvious substitution of positions.

If the computer, upon interrogating the third processing station, received a signal indicating that that station was not ready to receive a wafer, the computer would then check to determine if the wafers being fed into the second buffer storage station were from a first boat entered into the overall system after a master reset operation, which resets the entire operation. If it were such a first boat, the computer would then call BBE1 both filling and emptying and would then check to see if in reality BBE1 were filling. If this were not the first boat after the master reset, the next procedural step would simply be to check if BBE1 were filling. If BBE1 were not filling, then the computer would check to see if BBE2 were filling. If neither were filling, this would indicate that both were full and could receive no more wafers, so that the computer would then inhibit the second processing station feed and prevent wafers from being fed through, and then would return to the main program. If either BBE1 or BBE2 were filling, the subsequent steps would be the same, with the obvious substitutions depending upon which holding means was filling. Assuming that BBE1 were filling, the computer would check to determine if track 26' were busy and would wait until it is free. Once the track is free, the computer would remove the second processing station feed inhibit signal, turn off the vacuum at the holding station 86 and turn on the air supplies to both the holding station and to BBE1 to transport a wafer to BBE1, and at the same time calling the track 26' busy. As soon as a wafer is detected at the elevator BBE1, the vacuum line 42' would be activated to hold the wafer at that point. It would next be checked to see that the vacuum line was purged, indicating that the wafer had arrived. Next the air supply at both the holding station and at BBE1 would be turned off, and the vacuum at BBE1 would also be turned off so that the wafer at that station, aligned within a pair of the horizontally opposed slots on container 33', could be lifted up and held by an up signal to BBE1. The raising of BBE1 would continue until it had indexed to align the next lower pair of horizontally opposed slots with track 26'.

The computer then checks to determine if the wafer received represented the end of a feed boat into the system. If not, the track 26' busy signal would be removed and the computer would return to its main program. If that wafer did represent the end of a boat, the computer would remove the BBE1 filling signal and check to see if BBE2 were then emptying. If BBE2 were not emptying, then the computer would call BBE2 filling and remove the track 26' busy signal in order that BBE2 might fill. If, upon inquiry as to whether BBE2 were emptying or not, there were an indication that it was emptying, then, when BBE2 was no longer emptying, the computer would call BBE2 filling and would remove the track 26' busy and once again return to the main program.

From the foregoing description of the detailed steps involved in the operation of this buffer storage system, the basic steps may be seen from the schematic illustration of FIGS. 8A-8E in which only the most basic elements of the system are illustrated. The receiving and holding means BAE1 and BAE2 represent, as in the foregoing flow chart description, the buffer station elevators 32 and 34 combined with their respective wafer holding containers 33. Similarly, means BBE1 and BBE2 represent second buffer station elevators 32' and 34' combined with their respective wafer holding containers 33'.

In FIG. 8A it may be seen that at the first buffer storage station 2 positioned along the conveyor the first means BAE1 receives and temporarily holds a first wafer group comprising a predetermined number of wafers received from the first processing station 6. This element BAE1 continues to receive the wafers until it has stored this predetermined number before it begins feeding any of those wafers out to the next processing station. This first wafer group suitably comprises those wafers contained in a given boat or container inserted at the beginning of the wafer processing system, suitably just ahead of first processing station 6, thus defining a particular group of wafers of predetermined number whose identity is to be maintained throughout the processing sequence.

Once the first storage means BAE1 has received and held all the wafers in its first wafer group, it may then begin feeding wafers out to the second processing station 8, as illustrated in FIG. 8B. During this time any additional wafers received from the first processing station 6 will go to make up the second wafer group, which is to be stored in the second holding means BAE2 in the first buffer storage station. If, during the time that BAE1 is feeding wafers out to the second processing station 8, the second element BAE2 were to completely fill, then the feeding of wafers into the first processing station 6 would be inhibited until the wafer holding means BAE1 were again empty and available to receive. In this manner, discrete and identifiable groups of wafers may be sequentially processed through the entire system without mixing so that the identity of all those wafers is retained, and overflow of the first buffer station may be prevented.

Once wafers have been supplied to the second processing station 8, they may become available for supplying to the third processing station 10. During this time the feeding and receiving of wafers at the first buffer storage station 2 continues as described immediately above. If there are no wafers currently stored in either of the second buffer storage station holding elements BBE1 or BBE2, a wafer requested by third processing station 10 will pass linearly through the second buffer station 4 without stopping and will then continue on to third processing station 10, all as illustrated in FIG. 8C.

In FIG. 8D is illustrated the condition in which holding means BAE2 is filled and in which wafers are being supplied from BAE1 through the second processing station 8 at the same time that the third processing station 10 is requesting wafers be supplied to it. FIG. 8D further illustrates the condition in which a portion of the wafers fed out of BAE1 have been received into and held in BBE1 of the second storage unit, thus indicating that BAE1 has been supplying more wafers than were being requested by third processing station 10. Thus, both BAE1 and BBE1 are partially filled and BBE1 may be either supplying wafers to processing station 10 or just holding them. In this condition the computer, acting under the program described with respect to the flow chart above causes the wafers passed from BAE1 through second processing station 8 to be received and momentarily held at BBE1 prior to being passed on to the third processing station 10.

In FIG. 8E is illustrated the condition in which both BBE1 and BBE2 of the second processing station 4 and BAE2 of the first processing station have previously been filled with their predetermined wafer groups, and in which wafers of a new wafer group are being fed into BAE1. At this same time, the third processing station is requesting that wafers be supplied to it for further processing. Such wafers have been previously fed out of BBE2. In order to maintain the integrity of the previously defined wafer groups supplied to the different holding units, the computer control will cause the wafers to continue to be fed sequentially out of BBE2 to the third processing station and wafers received from first processing station 6 to be fed into BAE1. The computer inhibits and prevents the initiation of supplying any additional wafers from the first buffer storage station 2 to the second buffer storage station 4 until holding container BBE2 has been completely exhausted and is once again ready to receive wafers. Once BBE2 has exhausted its wafers, additional wafers to third processing station 10 may be supplied from BBE1 while wafers from BAE2 are used to refill BBE2.

While the invention of this disclosure has been described above in detail in an embodiment comprising three processing stations with two buffer storage units, one interposed between the first and second processing stations and the other interposed between the second and third processing stations, obviously the principles of this invention apply equally to wafer processing systems having a plurality of processing stations numbering from two to any desired number. Similarly, while each buffer storage unit has been described in detail with respect to an embodiment in which each buffer storage station includes two elevator/container holding means, the principles of the invention apply equally to buffer storage stations comprising one or any number of such storage means and the operation of the various holding means at each buffer storage station may be readily interchanged. The preceding embodiment has been selected for detailed description solely for purposes of illustrations and is in no way intended to limit the scope of the invention. Accordingly, since numerous variations and modifications of this invention will readily occur to those skilled in the art, the scope of this invention is to be limited solely by the claims appended hereto.

What is claimed is:

1. In a semiconductor wafer processing system having a plurality of processing stations spaced along a conveyor structure and in which the various processing stations may process wafers at different rates and in which each said processing station provides signals indicating its availability or unavailability for processing a wafer, buffer storage apparatus cooperating with three such processing stations, said buffer storage apparatus comprising a first buffer storage station positioned along said conveyor structure between a first and a second said processing stations and a second buffer storage station positioned along said conveyor structure between said second processing station and a third processing station, said first buffer storage station comprising first means for receiving and temporarily holding a first wafer group comprising a predetermined number of said wafers received from said first processing station and then supplying wafers from said first wafer group to said second processing station and thence to said second buffer storage station, and means for conveying a wafer received at said first buffer storage station to said first holding means and from said first holding means toward said second processing station; and second means for temporarily holding any additional wafers received from said first processing station during the time that said first receiving and holding means is holding or supplying to said second processing station wafers from said first wafer group; and said second buffer station comprising means for conveying a wafer received from said second processing station through said second buffer station to said third processing station if said third processing station is available for receiving said wafer, and means for receiving and temporarily holding said wafer received from said second processing station if said third processing station is unavailable for receiving said wafer and then subsequently supplying said held wafer to said third processing station when said third processing station is available.

2. Buffer storage apparatus according to claim 1 wherein said first buffer storage station second receiving and holding means is adapted to continue to receive and hold said wafers from said first processing station until it has received a second group of wafers comprising a predetermined number of said wafers and then, after said first buffer storage station first receiving and holding means has exhausted said first group of wafers in supplying wafers to said second processing station, to supply wafers from said second group to said second processing station and thence to said second buffer storage station.

3. Buffer storage apparatus according to claim 2 wherein said second buffer storage station further comprises first means for receiving and temporarily holding wafers from one of said first group or said second group of wafers from said second processing station when said third processing station is unavailable for receiving wafers and then supplying said wafers to said third processing station when said third processing station is available to receive wafers, and second means for receiving and temporarily holding any wafers received at said second buffer station from the other of said first group or said second group when one or more wafers of said one of said groups is being held in said second buffer station first holding means, such that all wafers from each said group from said first buffer station may be stored in only one of said second buffer station holding means, whereby intermingling of wafers from different groups may be avoided.

4. Buffer storage apparatus according to claim 3 further comprising means for sensing if any of said second buffer station receiving and holding means is filling and available for receiving and holding wafers and for preventing the initiation of supplying of wafers from any one of said first buffer station holding means unless at least one of said second buffer station holding means is filling and available for receiving and holding wafers.

5. Buffer storage apparatus according to claim 4 further comprising means for temporarily halting the supplying of said wafers from said first processing station whenever all of said first buffer station receiving and holding means are either supplying wafers to said second processing station or have received and are holding their said predetermined number of wafers, whereby a maximum of only the desired predetermined numbers of wafers will be present at the first buffer station and there will be no overflow of wafers at the first buffer station.

6. In a semiconductor wafer processing system having a plurality of processing stations spaced along a conveyor structure and in which the various processing stations may process wafers at different rates and in which each said processing station provides signals indicating its availability or unavailability for processing a wafer, buffer storage apparatus cooperating with three such processing stations, said buffer storage apparatus comprising a first buffer storage station positioned along said conveyor structure between a first and a second said processing stations and a second buffer storage station positioned along said conveyor structure between said second processing station and a third processing station, said first buffer storage station comprising first means for receiving and temporarily holding a first wafer group comprising a predetermined number of said wafers received from said first processing station and then supplying wafers from said first wafer group to said second processing station and thence to said second buffer storage station, and means for conveying a wafer received at said first buffer storage station to said first holding means and from said first holding means toward said second processing station; and said second buffer station comprising means for conveying a wafer received from said second processing station through said second buffer station to said third processing station if said third processing station is available for receiving said wafer, and means for receiving and temporarily holding said wafer received from said second processing station if said third processing station is unavailable for receiving said wafer and then subsequently supplying said held wafer to said third processing station when said third processing station is available;

each said wafer receiving and temporary holding means comprising a container having means defining a plurality of fixed wafer storage positions therewithin with each said storage position being selectively alignable with the adjacent said conveying means and providing selectively for reception and holding of a wafer therewithin without interruption or release and discharge of a wafer therefrom or passage therethrough without interruption with the direction of movement of said wafer for said reception, said discharge and said passage being the same, and means for supporting said container and for selectively aligning a desired said container fixed storage position with said conveying means.

7. Buffer storage apparatus according to claim 6 wherein said container comprises a frame having said fixed storage positions vertically spaced therewithin, and wherein said selective aligning means comprises means for moving said frame in a generally vertical direction.

8. Buffer storage apparatus according to claim 6 wherein said container is selectively removable from said supporting and aligning means and wherein said container further includes means engageable upon removal of said container from said supporting and aligning means to prevent discharge of wafers contained therewithin out the side of said container facing in said predetermined direction when said container is so removed.

9. Buffer storage apparatus according to claim 8 wherein said discharge-preventing means comprises a plate insertable across said container side when said storage container is removed from said supporting and aligning means.

10. Buffer storage apparatus according to claim 9 further comprising means moving said plate from a discharge-preventing relationship with said storage position aligned with said conveyor structure to a discharge-permitting relationship when said container is received by said storage container and supporting and aligning means.

11. In a semiconductor wafer processing system having a plurality of processing stations spaced along a conveyor structure and in which a subsequent processing station may process wafers at a rate different from that of a preceding processing station and in which each said processing station provides signals indicating its availability or unavailability for processing a wafer, buffer storage apparatus positioned along said conveyor structure between the preceding station and the subsequent station, comprising first means for receiving and temporarily holding a first group of wafers comprising a predetermined number of said wafers received from said preceding station and then supplying wafers from said first group to said subsequent processing station when said subsequent processing station is available for receiving wafers;

second means for receiving and temporarily holding any additional said wafers received from said preceding processing station during the time that said first receiving and holding means is holding or supplying wafers from said first group, said second receiving and holding means continuing to receive and hold said wafers from said preceding processing station until it has received and held a second group of wafers comprising a predetermined number of said wafers and then, after said first receiving and holding means has exhausted said first group of wafers in supplying wafers to said subsequent processing station, supplying wafers from said second group to said subsequent processing station when said subsequent processing station is available for receiving wafers.

12. Buffer storage apparatus according to claim 11 wherein said first holding means, after it has exhausted its said group of wafers and while said second holding means is supplying wafers to said subsequent processing station, receives and temporarily stores any additional wafers received from said preceding processing station.

13. Buffer storage apparatus according to claim 11 further comprising means for temporarily halting the supplying of said wafers from said preceding processing station whenever all of said holding means are either supplying wafers to said subsequent processing station or have received and are holding their said predetermined number of wafers, whereby only the desired predetermined numbers of wafers will be present at the buffer station and there will be no overflow of wafers at the buffer station.

14. In a semiconductor wafer processing system having a plurality of processing stations spaced along a conveyor structure in which a subsequent processing station may process wafers at a rate different from that of a preceding processing station and in which each said processing station provides signals indicating its availability or unavailability for processing a wafer, a buffer storage station positioned along said conveyor structure between said preceding processing station and said subsequent processing station, comprising means for conveying a wafer received by said storage station linearly therethrough to said subsequent processing station in response to a subsequent station availability signal;

means selectively operable in response to a subsequent station unavailability signal to stop said linear movement of a wafer passing through said storage station on said conveying means; and means for temporarily holding said stopped wafer received from said conveying means in response to said subsequent station unavailability signal and for feeding a previously held said wafer onto said conveying means in response to said subsequent station availability signal when no wafer is available on said storage apparatus conveying means and there is at least one said wafer being held in said wafer holding means, whereby a smooth flow of wafers may be provided from a preceding station and into a subsequent station despite differences in their respective rates of wafer processing, said wafer holding means comprising a container having means defining a plurality of fixed wafer storage positions therewithin with each said storage position being selectively alignable with said conveying means and providing selectively for either passage of a wafer therethrough in a single direction without interruption or reception and holding a wafer therewithin or release and discharge of a wafer therefrom, and means for supporting said container and for selectively aligning a desired said container fixed storage position with said conveying means such that an empty said storage position is aligned with said conveying means for passing through said wafer from said preceding station or for receiving a held said wafer.

15. Buffer storage apparatus according to claim 14 wherein said container comprises a frame having said fixed storage positions vertically spaced therewithin, and wherein said selective aligning means comprises means for moving said frame in a generally vertical direction.

16. Buffer storage apparatus according to claim 14 wherein said wafer holding means further comprises means for sensing the presence of said stopped wafer and then causing said supporting and aligning means to move said wafer-receiving storage position out of alignment with said conveying means to hold said stopped wafer in response to said subsequent station unavailability signal.

17. Buffer storage apparatus according to claim 14 wherein said wafer holding means further comprises means for causing said supporting and aligning means to move a wafer-containing said fixed storage position into alignment with said conveying means for release and discharge of said contained wafer in response to said subsequent station availability signal when no wafer is available on said storage apparatus conveying means and at least one said wafer is being held in said container, whereby that wafer from the storage container may be provided to the subsequent station to maintain a smooth flow of wafers to that subsequent station.

18. Buffer storage apparatus according to claim 14 wherein said container is selectively removable from said supporting and aligning means and wherein said container further includes means engageable upon removal of said container from said supporting and aligning means to prevent discharge of wafers contained therewithin out the side of said container facing in said predetermined direction when said container is so removed.

19. Buffer storage apparatus according to claim 18 wherein said discharge-preventing means comprises a plate insertable across said container side when said storage container is removed from said supporting and aligning means.

20. Buffer storage apparatus according to claim 19 further comprising means moving said plate from a discharge-preventing relationship with said storage position aligned with said conveyor structure to a discharge-permitting relationship when said container is received by said storage container and supporting and aligning means.

21. Buffer storage apparatus according to claim 14 further comprising, in combination, a plurality of said wafer holding means mounted in tandem along said conveying means and means for sensing when a first said holding means is filled with said held wafers and causing additional said held wafers to be held by another of said tandem mounted wafer holding means, whereby the wafer holding capacity of said wafer storage apparatus may be increased.

22. Buffer storage apparatus according to claim 21 wherein said first holding means comprises the holding means distal said subsequent station and proximal said preceding station and wherein the subsequently filled holding means comprise the holding means closer to said subsequent station and more distant from said preceding station, whereby the holding means closest to the preceding station is filled first and then more distant holding means are filled.

23. Buffer storage apparatus according to claim 22 wherein said containers are removably supported upon said supporting and aligning means, whereby, upon the filling of the first container and then the holding of additional wafers by another container, the first container may be removed from its supporting and aligning means and replaced with an empty container for subsequently receiving and storing additional wafers.

* * * * *